United States Patent
Ishida et al.

(10) Patent No.: US 10,560,615 B2
(45) Date of Patent: Feb. 11, 2020

(54) ELECTRONICS APPARATUS

(71) Applicant: SONY CORPORATION, Tokyo (JP)

(72) Inventors: Yuichi Ishida, Kanagawa (JP); Taiki Sugiyama, Kanagawa (JP); Takashi Oishi, Tokyo (JP); Kazuhiko Suzuki, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/769,529

(22) PCT Filed: Oct. 4, 2016

(86) PCT No.: PCT/JP2016/004469
§ 371 (c)(1),
(2) Date: Apr. 19, 2018

(87) PCT Pub. No.: WO2017/081833
PCT Pub. Date: May 18, 2017

(65) Prior Publication Data
US 2018/0316837 A1 Nov. 1, 2018

(30) Foreign Application Priority Data

Nov. 10, 2015 (JP) .................... 2015-220201

(51) Int. Cl.
*H04N 5/225* (2006.01)
*H01M 10/613* (2014.01)
(Continued)

(52) U.S. Cl.
CPC ..... *H04N 5/22521* (2018.08); *H01L 23/3675* (2013.01); *H01L 23/3737* (2013.01);
(Continued)

(58) Field of Classification Search
CPC ............ H04N 5/22521; H01M 10/613; H01M 10/623; H01M 10/659; H01M 2220/30;
(Continued)

(56) References Cited

U.S. PATENT DOCUMENTS 8,587,945 B1\* 11/2013 Hartmann .......... H05K 7/20454
361/679.53
9,105,951 B2\* 8/2015 Anderson-Straley .......................
H01M 10/625
(Continued)

FOREIGN PATENT DOCUMENTS

CN 105393651 A 3/2016
JP 2001-274580 A 10/2001
(Continued)

OTHER PUBLICATIONS

International Search Report and Written Opinion of PCT Application No. PCT/JP2016/004469, dated Dec. 27, 2016, 09 pages of ISRWO.

*Primary Examiner* — Dion Ferguson
*Assistant Examiner* — Amir A Jalali
(74) *Attorney, Agent, or Firm* — Chip Law Group

(57) ABSTRACT

There is provided an electronic apparatus that includes a housing. A control circuit is provided inside the housing, a battery is provided inside the housing, a heat storage material is provided between the control circuit and the battery inside the housing, and a gap is provided between the control circuit and the battery.

10 Claims, 5 Drawing Sheets

(51) Int. Cl.
   *H01M 10/623*   (2014.01)
   *H01M 10/659*   (2014.01)
   *H01L 23/367*   (2006.01)
   *H01L 23/373*   (2006.01)
   *H01L 27/146*   (2006.01)
   *H01L 31/024*   (2014.01)
   *H05K 7/20*   (2006.01)

(52) U.S. Cl.
   CPC ...... *H01L 27/14618* (2013.01); *H01L 31/024* (2013.01); *H01M 10/613* (2015.04); *H01M 10/623* (2015.04); *H01M 10/659* (2015.04); *H05K 7/20436* (2013.01); *H01M 2220/30* (2013.01)

(58) Field of Classification Search
   CPC ..... F28D 20/02; G03B 17/55; H01L 23/3675; H01L 23/3737; H01L 27/14618; H01L 31/024; H05K 1/02–0203; H05K 7/209; H05K 7/2039; H05K 7/20436; H05K 7/20545; H05K 7/20963; G11C 5/141; G06F 1/20; G06F 1/203; G06F 2021/0028
   USPC .................. 361/700, 679.54, 709–711, 715; 174/548; 362/373
   See application file for complete search history.

(56) References Cited

U.S. PATENT DOCUMENTS

| | | | | |
|---|---|---|---|---|
| 2008/0019502 | A1* | 1/2008 | Emmert | H04M 1/026 379/433.07 |
| 2013/0308282 | A1* | 11/2013 | Shin | H05K 7/14 361/749 |
| 2014/0078679 | A1* | 3/2014 | Tsunoda | G06F 1/203 361/720 |
| 2014/0321058 | A1* | 10/2014 | Fujieda | G06F 1/203 361/700 |
| 2015/0350392 | A1* | 12/2015 | Park | H04M 1/0202 455/575.6 |
| 2016/0156213 | A1* | 6/2016 | Yajima | H01M 10/623 320/152 |
| 2016/0227654 | A1* | 8/2016 | Kim | G06F 1/16 |

FOREIGN PATENT DOCUMENTS

| | | |
|---|---|---|
| JP | 2003-244011 A | 8/2003 |
| JP | 2007-150521 A | 6/2007 |
| JP | 2015-029036 A | 2/2015 |
| JP | 2015-198319 A | 11/2015 |
| WO | 2014/208066 A2 | 12/2014 |

\* cited by examiner

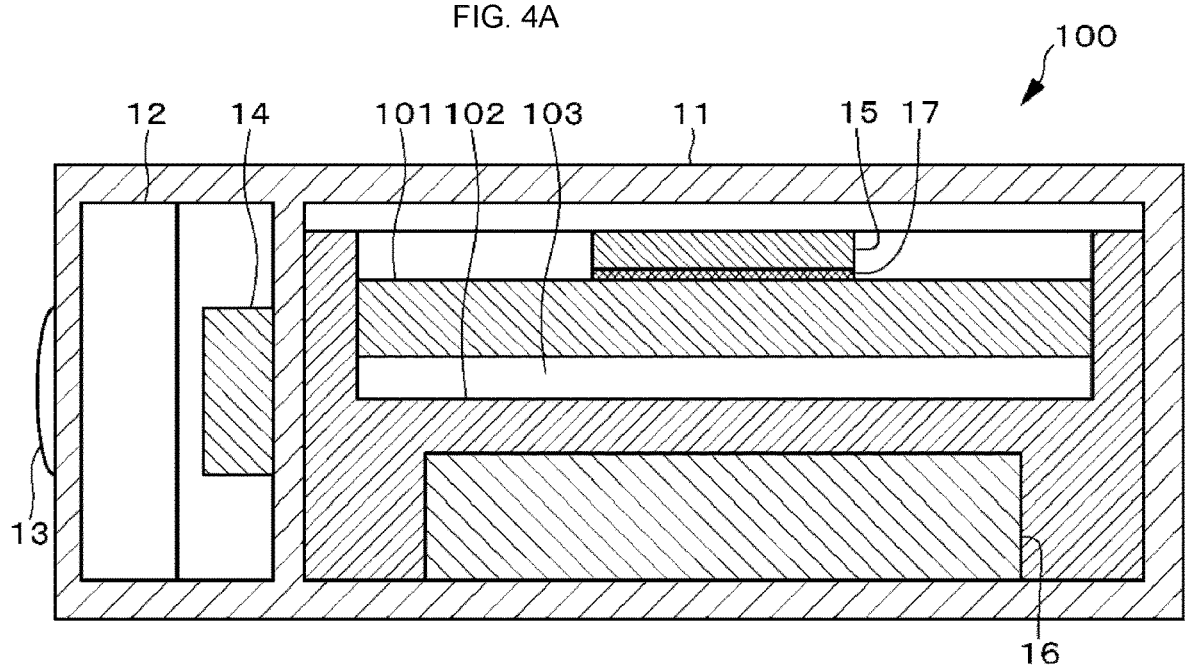
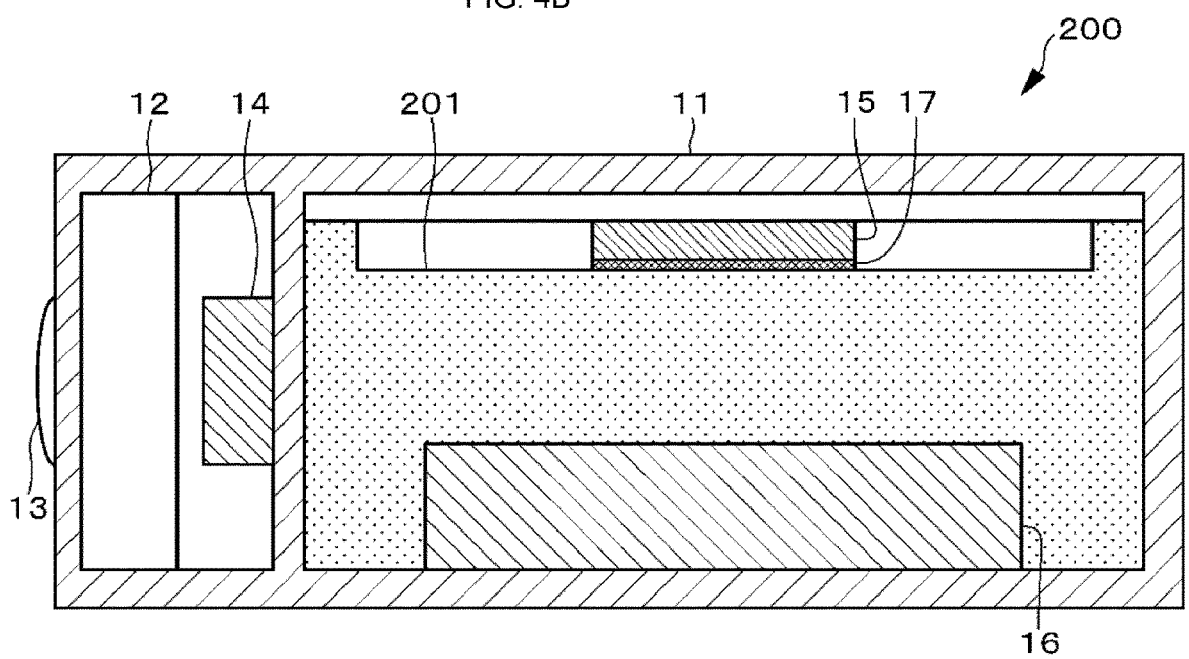

US 10,560,615 B2

ELECTRONICS APPARATUS

CROSS REFERENCE TO RELATED APPLICATIONS

This application is a U.S. National Phase of International Patent Application No. PCT/JP2016/004469 filed on Oct. 4, 2016, which claims priority benefit of Japanese Patent Application No. JP 2015-220201 filed in the Japan Patent Office on Nov. 10, 2015. Each of the above-referenced applications is hereby incorporated herein by reference in its entirety.

TECHNICAL FIELD

The present technology relates to an electronic apparatus.

BACKGROUND ART

In an electronic apparatus such as a digital camera, miniaturization is demanded while power consumption is increased due to achievement of high performance, and it is a serious problem to suppress temperature rise caused by heat generation of an internal component. Excessive temperature rise of an electronic component may damage reliability and a function of the component and may shorten the life of an apparatus. Additionally, temperature rise of a housing portion may give a user discomfort feeling or may cause low temperature burn during use. Therefore, as a method to solve such a heat problem, there is a disclosed method in which a heat storage material is used to absorb heat to suppress temperature rise (Patent Document 1).

CITATION LIST

Patent Document

Patent Document 1: Japanese Patent Application Laid-Open No. 2001-274580

SUMMARY OF THE INVENTION

Problems to Be Solved By the Invention

Patent Document 1 discloses a technology in which high temperature in a housing of an electronic apparatus and temperature rise inside thereof are suppressed by using a latent heat storage material, and cooling is continuously performed with a replaceable heat storage material. However, there is a limit temperature up to which each of electronic members disposed inside can be used, and it is necessary to provide a total heat design including a heat storage material so as not to exceed such a limit temperature. Particularly, a battery generally has a temperature limit lower than that of a semiconductor chip, and therefore, it is further necessary to suppress heat transfer from the semiconductor chip.

The present technology is made in view of the above-described problems, and directed to providing an electronic apparatus in which a high temperature in a housing and temperature rise inside thereof can be efficiently suppressed.

Solutions to Problems

To solve the above-described problems, the present technology provides an electronic apparatus including: a housing; a control circuit provided inside the housing; a battery provided inside the housing; a heat storage material provided between the control circuit and the battery inside the housing; and a gap provided between the control circuit and the battery.

Effects of the Invention

According to the present technology, it is possible to efficiently suppress a high temperature in the housing of the electronic apparatus and temperature rise inside thereof. Note that the effects recited herein are not necessarily limited and may be any one of those recited in the present specification.

BRIEF DESCRIPTION OF DRAWINGS

FIG. 4A is a schematic cross-sectional plan view illustrating an internal configuration of an electronic apparatus according to Comparative Example 1, and FIG. 4B is a schematic cross-sectional plan view illustrating an internal configuration of an electronic apparatus according to Comparative Example 2.

MODE FOR CARRYING OUT THE INVENTION

In the following, embodiments of the present technology will be described with reference to the drawings. Note that the description will be provided in the following order.
<1. First Embodiment>
[1-1. Configuration of Electronic Apparatus]
[1-2. Effects by Heat Storage Material]
<2. Second Embodiment>
[2-1. Configuration of Electronic Apparatus]
<3. Third Embodiment>
[3-1. Configuration of Electronic Apparatus]
<4. Modified Examples>

1. FIRST EMBODIMENT

Figure 1:
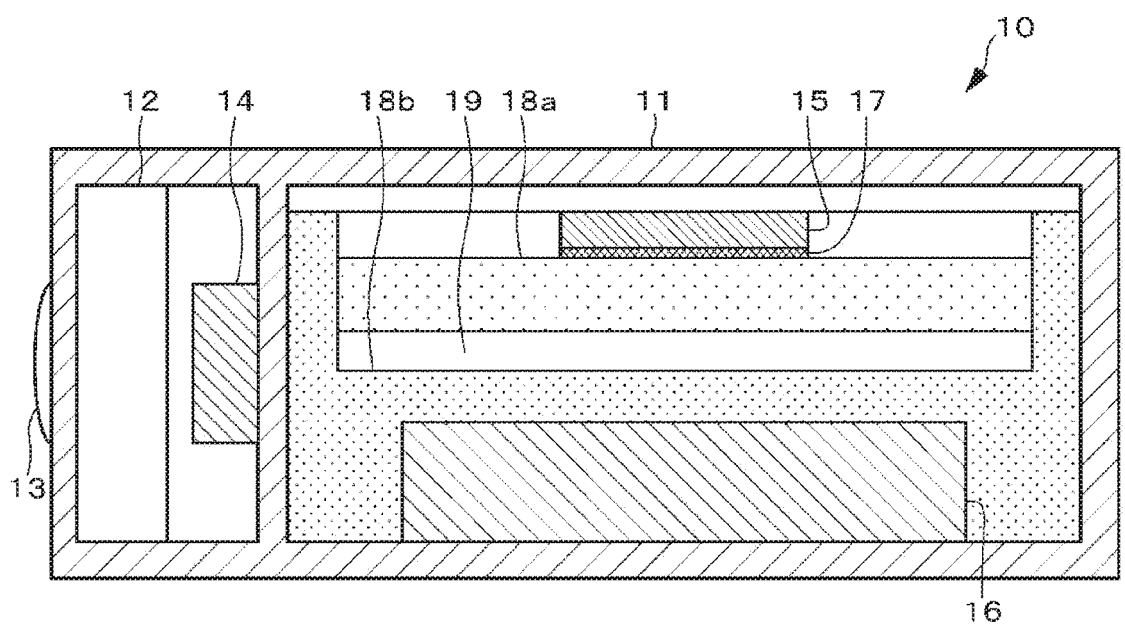
FIG. 1 is a schematic cross-sectional plan view illustrating an internal configuration of an electronic apparatus according to a first embodiment.

[1-1. Configuration of Electronic Apparatus]
First, an exemplary configuration of an imaging device that is an electronic apparatus 10 according to a first embodiment will be described. FIG. 1 is a schematic cross-sectional plan view illustrating a configuration of an electronic apparatus 10.

The electronic apparatus 10 includes a housing 11, a lens barrel 12, an imaging element 14, a control circuit 15, a battery 16, a heat dissipation sheet 17, a first heat storage material 18a, and a second heat storage material 18b.

The housing 11 includes a synthetic resin such as plastic, a metal, or the like, and constitutes an outer package of the electronic apparatus 10. The lens barrel 12, imaging element 14, control circuit 15, battery 16, first heat storage material 18a, and second heat storage material 18b are provided inside the housing 11.

The inside of the lens barrel 12 is provided with a drive mechanism, an iris mechanism, a shutter mechanism, and the like in order to perform focusing and zooming by moving a photographing lens 13 to converge light from a subject on the imaging element 14. These mechanisms are driven under the control of the control circuit 15. An optical image of a subject obtained through the photographing lens 13 is formed on the imaging element 14. The drive mechanism, iris mechanism, shutter mechanism, and the like are operated under the control of the control circuit 15 by a lens drive driver not illustrated including, for example, a microcomputer, and the like.

The imaging element 14 photoelectrically converts incident light from a subject, converts the same into an electric charge amount, and outputs the electric charge amount as an analog imaging signal. The analog imaging signal output from the imaging element 14 is output to the control circuit 15. As the imaging element 14, a charge coupled device (CCD), a complementary metal oxide semiconductor (CMOS), or the like is used. The imaging element 14 is one of heat sources in the electronic apparatus 10.

The control circuit 15 includes a central processing unit (CPU), a random access memory (RAM), a read only memory (ROM), and the like. In the ROM, for example, a program read and executed by the CPU is stored. The RAM is used as a work memory of the CPU. The CPU executes various kinds of processing in accordance with the program stored in the ROM, and performs control for entire portions and respective portions of the electronic apparatus 10 by issuing commands. The control circuit 15 is mounted on the electronic apparatus 10 in a form of, for example, a semiconductor integrated circuit, a semiconductor chip, or the like. The control circuit 15 is one of heat sources in the electronic apparatus 10.

The control circuit 15 performs, for example, sample and hold for an imaging signal output from the imaging element 14 so as to keep a good signal/noise (S/N) ratio by correlated double sampling (CDS) processing. Additionally, gain is controlled by auto gain control (AGC) processing, and a digital image signal is output by performing analog/digital (A/D) conversion.

Furthermore, the control circuit 15 performs predetermined signal processing such as demosaic processing, white balance adjustment processing, color correction processing, gamma correction processing, Y/C conversion processing, auto exposure (AE) processing, and resolution conversion processing. Furthermore, the control circuit 15 applies, to image data subjected to predetermined processing, coding processing for recording or communication, for example.

The battery 16 is an electric power source in order to supply electric power to the respective portions constituting the electronic apparatus 10. As the battery 16, a lithium ion battery is used, for example. The battery 16 is one of heat sources in the electronic apparatus 10.

The heat dissipation sheet 17 is provided in a manner interposed between the control circuit 15 and the first heat storage material 18a, and contacts the control circuit 15. The heat dissipation sheet 17 is used to dissipate heat generated from the control circuit 15. Note that the heat dissipation sheet 17 is not indispensable in the present technology although temperature rise of the control circuit 15 can be suppressed by providing the heat dissipation sheet 17.

The first heat storage material 18a is provided on the control circuit 15 side inside the housing 11. The first heat storage material 18a is thermally connected, via the heat dissipation sheet 17, to a surface of the control circuit 15 facing the battery 16. The first heat storage material 18a is used to suppress temperature rise in the electronic apparatus 10 by storing heat generated from the control circuit 15 in a form of latent heat.

The second heat storage material 18b is provided on the battery 16 side inside the housing 11. The second heat storage material 18b also functions as a battery case. The second heat storage material 18b is thermally connected to a surface of the battery 16 facing the control circuit 15, and is used to suppress temperature rise in the electronic apparatus 10 by storing heat generated from the battery 16 in a form of latent heat.

A gap 19 is provided between the first heat storage material 18a and the second heat storage material 18b. The gap 19 is located between the first heat storage material 18a and the second heat storage material 18b and provided in a manner interposed between the control circuit 15 and the battery 16. The gap 19 is used to suppress heat generated from the control circuit 15 from being transferred to the battery 16 via the first heat storage material 18a and the second heat storage material 18b, and suppress temperature rise of the battery 16. In the present embodiment, the gap 19 is substantially linearly formed in a manner extending substantially perpendicular to a direction in which the control circuit 15 and the battery 16 are aligned.

A size of the gap 19 (distance between the first heat storage material 18a and the second heat storage material 18b) is varied by a size of the electronic apparatus 10, but preferably, the size is at least 0.1 mm or more. In the present embodiment, the size of the gap is set to 0.7 mm.

In the present embodiment, the first heat storage material 18a is formed in a rectangular parallelepiped shape having a substantially rectangular shape in the plan view. The surface of the second heat storage material 18b on the first heat storage material 18a side is formed in a recessed shape, and both ends of the first heat storage material 18a are formed in a manner respectively contacting an inner surface of the second heat storage material 18b. The both ends of the first heat storage material 18a may be preferably fixed to the inner surface of the second heat storage material 18b with an adhesive or the like.

With this configuration, the first heat storage material 18a and the second heat storage material 18b can be kept in a more stable state compared to a state in which the first heat storage material 18a and the second heat storage material 18b are provided separately without contacting each other. Meanwhile, any shape is applicable as far as the end portions are connected while interposing the gap 19 between the first heat storage material 18a and the second heat storage material 18b. For example, the first heat storage material 18a may be formed in a substantially recessed shape, the second heat storage material 18b may be formed in a rectangular parallelepiped shape having a substantially rectangular shape in the plan view, and both ends of the second heat storage material 18b may be formed in a manner respectively contacting an inner surface of the first heat storage material 18a.

Figure 2:
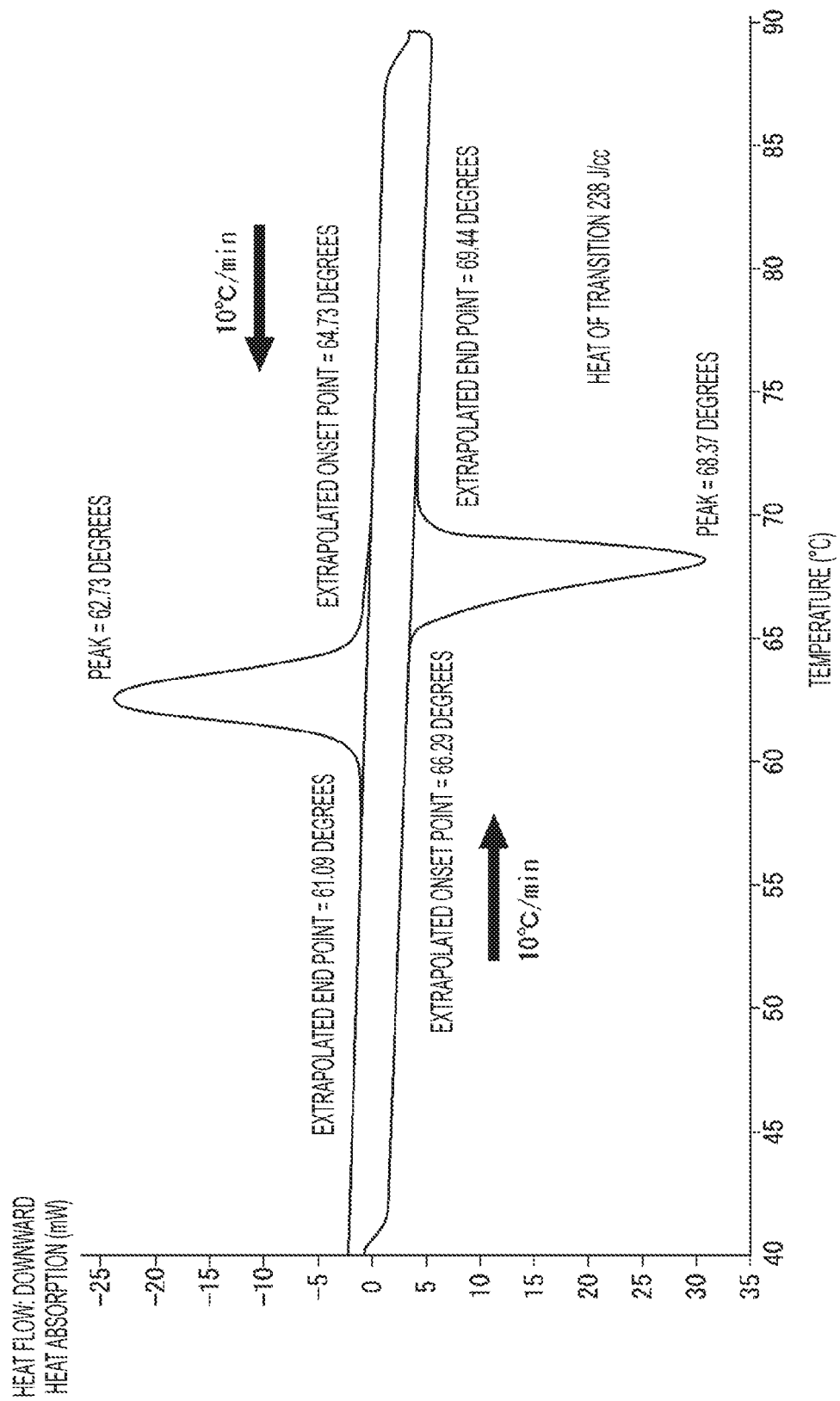
FIG. 2 is a graph to describe a transition temperature of a heat storage material.

The first heat storage material 18a and the second heat storage material 18b are each includes a latent heat storage material that is subjected to phase transition at a temperature from 0 degrees to 100 degrees. More specifically, the first heat storage material 18a provided on the control circuit 15 side has a transition temperature of about 50 degrees to about 80 degrees. Additionally, the second heat storage material 18b provided on the battery 16 side has a transition temperature of about 40 degrees to 70 degrees. The reason is that a temperature of the control circuit 15 generally tends to rise more easily than that of the battery 16 during use of the electronic apparatus 10. However, in a case where the temperature of the battery 16 tends to rise more easily than that of the control circuit 15, the transition temperature of the second heat storage material 18b on the battery 16 side may be set higher than the transition temperature of the first heat storage material 18a on the control circuit 15 side. An effect of temperature rise suppression can be further enhanced by thus optimizing a transition temperature in accordance with a heat source. Meanwhile, the term "transition temperature" referred to herein is a temperature at which transition starts, and is different depending on a substance. For example, as illustrated in differential scanning calorimetry (DSC) measurement results of $VO_2$ powder in FIG. 2, a transition temperature of $VO_2$ described below is about 66 to 68 degrees, and the transition temperature can be lowered by doping the $VO_2$ powder with a small amount of a different element such as tungsten (W). Therefore, this is a suitable heat storage material as the first heat storage material 18a and the second heat storage material 18b. In the measurement results illustrated in FIG. 2, a transition start temperature at the time of temperature rise is 66.3 degrees, an end temperature is 69.4 degrees, and a transition width is 3.1 degrees resulting in a sharp transition. Additionally, heat of transition is 238 J/cc that is quite high. This transition temperature can be changed by performing doping with tungsten (W) or the like.

As a latent heat storage material, it is possible to use, for example, a composite material of $VO_2$ and a resin obtained by compounding $VO_2$, namely, a solid phase transition material with a resin (plastic such as polycarbonate or ABS resin). Additionally, it is possible to use, for example, a composite material of $VO_2$ and a metal obtained by combining $VO_2$ with a metal (aluminum, aluminum alloy, magnesium alloy, copper, or the like).

The composite material of $VO_2$ and a resin is characterized in having a high thermal conductivity of about 1 W/m·K (general resin and plastic have a thermal conductivity of 0.2 W/m·K). This is a performance level equivalent to that of a thermally conductive resin (resin having high heat radiation performance). In a case of the composite material of $VO_2$ and a resin, it is also advantageous that a desired shape can be formed at a low process cost in addition to having heat storage performance and heat radiation performance. A V resin-based heat storage member having a desired shape can be formed by mixing the $VO_2$ powder with the resin, pelletizing the same, and performing injection molding. In a case of using such a heat storage member in a place where a resin member is used, heat storage performance can be provided as it is.

The composite material of $VO_2$ and a metal is a heat storage material having high thermal conductivity and high heat radiation performance. For example, in a case of charging $VO_2$ powder and Al powder in a carbon mold and melting the mixed powder at 700 degrees under a high pressure to prepare a composite of $VO_2$ and Al (42 vol % and 58 vol % respectively), characteristics of a latent heat storage density of 100 J/cc and a thermal conductivity of 63 W/m·K are obtained. This is a value higher than a thermal conductivity of stainless steel (SUS) of 15 W/m·K.

Although not illustrated, the electronic apparatus 10 may further include a storage medium, a display unit, an input unit, a communication terminal, and the like. The storage medium is a large-capacity storage medium such as a hard disc drive (HDD), a solid state drive (SSD), and an SD memory card, for example. An image photographed by the electronic apparatus 10 is stored in a compressed state on the basis of a standard such as a joint photographic experts group (JPEG), for example. Additionally, exchangeable image file format (EXIF) data including information related to a stored image and additional information such as a date and a time of imaging is also stored in a manner correlated to the image. Additionally, a moving image is saved in a format such as a moving picture experts group 2 (MPEG2), MPEG 4, for example.

The display unit is a display device including, for example, a liquid crystal display (LCD), a plasma display panel (PDP), an organic electro luminescence (EL) panel, or the like. On the display unit, a user interface of the electronic apparatus 10, a menu screen, a monitoring image during imaging, a photographed image recorded on the storage medium, a photographed moving image, and the like are displayed.

For example, the input unit may include a power button to turn on/off power supply, a release button to instruct start of recording a photographed image, a zoom adjustment operator, a touch screen integrated with the display unit, and the like. When input operation is made to the input unit, a control signal according to the input is generated and output to the control circuit 15. Then, the control circuit 15 performs calculation processing and control in accordance with the control signal.

The communication terminal is used to connect the electronic apparatus 10 to an external apparatus by using a cable. With this connection, data exchange can be performed between the electronic apparatus 10 and the external apparatus. Examples of the external apparatus include a personal computer, a printer, a smartphone, a tablet terminal, a storage device such as a hard disk drive or a universal serial bus (USB) memory, a display device such as a television or a projector, and the like. Examples of communication standards include a USB, a local area network (LAN), a high-definition multimedia interface (HDMI, and the like. Meanwhile, communication with an external device is not limited to wired connection, and may be performed by radio connection by using wireless fidelity (Wi-Fi), radio LAN, ZigBee, Bluetooth, and the like.

The electronic apparatus 10 is formed as described above.

Note that, as an organic latent heat storage material used for the first heat storage material 18a and the second heat storage material 18b, it is possible to use, for example, paraffin (n-nonadecane, n-icosane, n-henicosane, n-docosane, n-tricosane, n-tetracosane, n-pentacosane, n-hexacosane, n-heptacosane, n-octacosane, n-nonacosane, n-triacontane, n-hentriacontane, n-dotriacontane, n-tritriacontane, paraffin wax, and the like), fatty acid or fatty acid ester (capric acid, undecylic acid, lauric acid, tridecylic acid, myristic acid, pentadecylic acid, palmitic acid, margaric acid, stearic acid, nonadecylic acid, arachidic acid, heneicosylic acid, behenic acid, lignoceric acid, triacontanoic acid, hydroxystearic acid, sebacic acid, crotonic acid, elaidic acid, erucic acid, nervonic acid, fatty acid esters, and the like (including ester of the fatty acid)), sugar alcohols, (xylitol, erythritol, mannitol, sorbitol, galactitol, threitol, and the like) and the like. Also, besides the above materials, it may be possible to use polyethylene, tetradecanol, dodecanol, polyglycol, naphthalene, propionamide, acetamide, biphenyl, dimethylsulfoxide, trimethylol ethane hydrate, side chain crystalline polymer, organometallic complex, and the like. Furthermore, a mixture or an eutectic crystal of two or more of these organic materials may also be used, or a mixture added with another sub-component (benzoic acid, urea, water, or the like) may also be used while using one or more of the above organic materials as a main component.

As an inorganic hydrated salt-based latent heat storage material, it is possible to use, for example, sodium acetate hydrate, potassium acetate hydrate, sodium hydroxide hydrate, potassium hydroxide hydrate, potassium hydroxide hydrate, strontium hydroxide hydrate, barium hydroxide hydrate, sodium chloride hydrate, magnesium chloride hydrate, potassium chloride hydrate, calcium chloride hydrate, zinc chloride hydrate, lithium nitrate hydrate, magnesium nitrate hydrate, calcium nitrate hydrate, aluminum nitrate hydrate, cadmium nitrate, iron nitrate hydrate, zinc nitrate hydrate, manganese nitrate hydrate, lithium sulfate hydrate, sodium sulfate hydrate, magnesium sulfate hydrate, calcium sulfate hydrate, potassium aluminum sulfate hydrate, aluminum ammonium sulfate hydrate, sodium thiosulfate hydrate, potassium phosphate hydrate, sodium phosphate hydrate, potassium hydrogen phosphate hydrate, sodium hydrogen phosphate hydrate, sodium borate hydrate, calcium bromide hydrate, potassium fluoride hydrate, sodium carbonate hydrate, and the like. Also, a mixture or eutectic crystal of two or more of these inorganic hydrated salt-based materials may also be used, or a mixture added with another sub-component (urea, ammonium salt, water, or the like) may also be used while using one or more of the above materials as a main component.

Since both of the organic latent heat storage material and the inorganic hydrated salt-based latent heat storage material are subjected to solid-liquid transition and are liquefied at a temperature higher than a phase change temperature, a container is needed in order to use these latent heat storage materials as the first heat storage material 18a and the second heat storage material 18b. In other words, when these heat storage materials are mixed with a resin or a metal, it is necessary to apparently form a solid by putting these materials in the container such as a micro-capsule. Therefore, the above-described heat storage materials can be compounded with a resin or a metal by enclosing the above-described organic latent heat storage material and inorganic hydrated salt-based latent heat storage material inside the micro-capsule (including a resin, inorganic glass, or the like).

Examples of a solid phase transition heat storage material include: electron phase transition heat storage material (for example, it is possible to use $VO_2$, a vanadium oxide obtained by doping $VO_2$ with W, Re, Mo, Ru, Nb, Ta, or the like, and a material including any one of $LiMn_2O_4$, $LiVS_2$, $LiVO_2$, $NaNiO_2$, $REBaFe_2O_5$, $REBaCo_2O_{5.5}$ "here RE includes rare earth elements such as Y, Sm, Pr, Eu, Gd, Dy, Ho, Tb, and the like". Additionally, it may be possible to use, for example, a mixture of two or more of these materials, or it may be possible to use a mixture further added with another sub-component while using one or more of these materials as a main component); a thermochromic material (such as N, N-diethylethylenediamine copper complex); a soft-viscous crystal (trimethylol ethane, pentaerythritol, neopentyl glycol, or the like); other solid-solid structural phase transition materials; and the like.

Since these solid phase transition heat storage materials remain as solids before and after phase transition, a container such as a micro-capsule is not necessary, and powder can be mixed with a resin or a metal as they are. Since any container such as a micro-capsule is not necessary, there are advantages in which, for example, a ratio of a heat storage material can be increased, and excellent strength, durability, and heat resistance can be achieved.

The examples of the latent heat storage material are listed above, but the latent heat storage material is not limited thereto, and other latent heat storage materials may also be used.

Meanwhile, as the first heat storage material 18a and the second heat storage material 18b, both of insulating and non-insulating properties are applicable. In a case where the heat storage material is electrically conductive and may cause short circuit at the time of contacting a metal portion of the control circuit 15 or the like, the first heat storage material 18a and the second heat storage material 18b can be formed while coating the control circuit 15 or the like with a thin insulating material, for example.

[1-2. Effects by Heat Storage Material]

Figure 3:
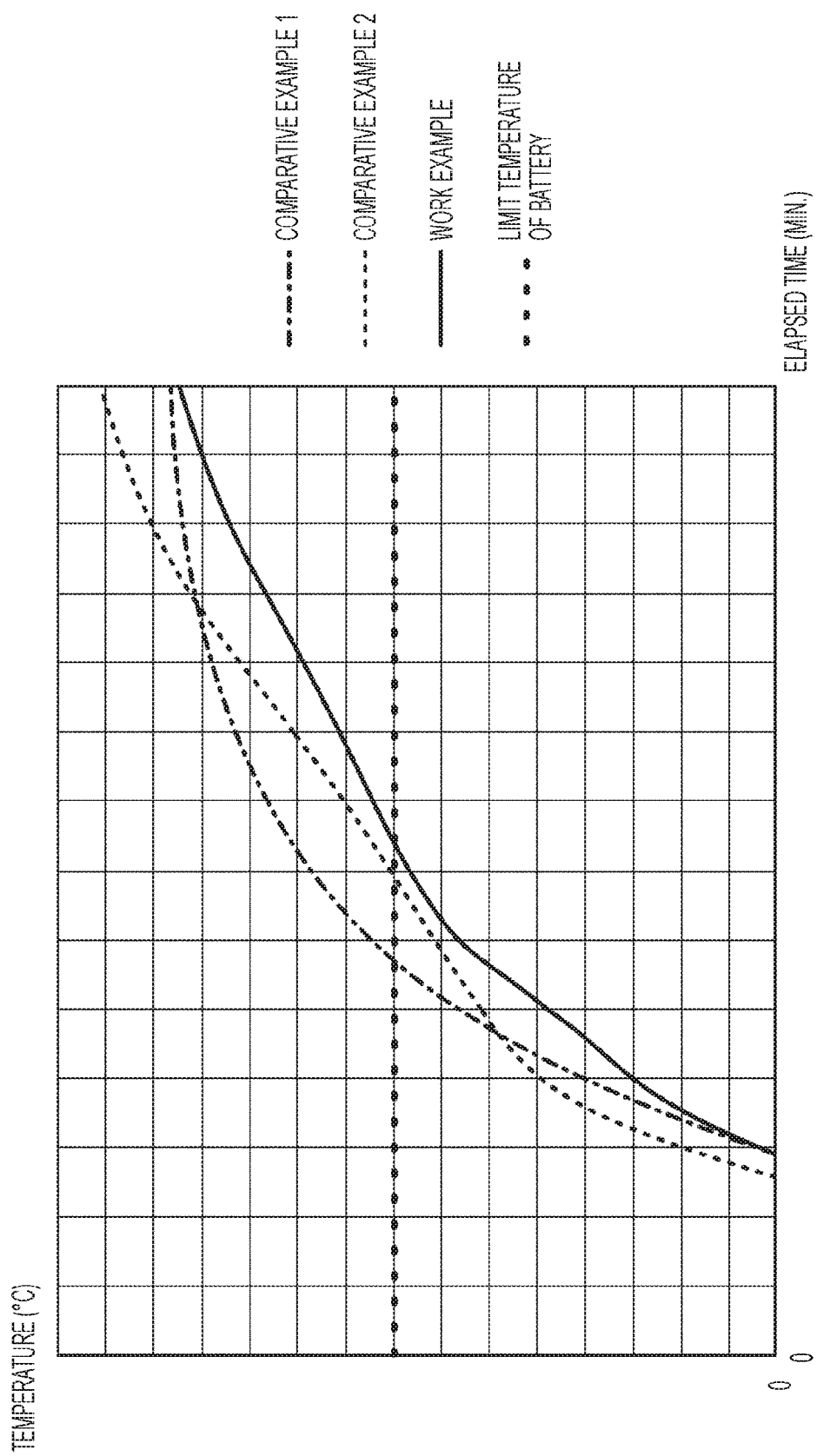
FIG. 3 is a graph illustrating temperature change of a battery included in an electronic apparatus.

Next, the effects of temperature rise suppression in the electronic apparatus 10 provided by the first heat storage material 18a and the second heat storage material 18b will be described. FIG. 3 is a graph illustrating temperature change of the battery 16 included in the electronic apparatus 10.

A temperature simulation at the time of photographing a moving image in a 40-degree environment was performed and temperature change of the battery 16 was measured for each of three cases including comparative Example 1, Comparative Example 2 and Work Example described below.

COMPARATIVE EXAMPLE 1

As illustrated in FIG. 4A, an aluminum sheet metal 101 (not including $VO_2$) was provided in a manner contacting a control circuit 15 without providing any heat storage material inside a housing 11 of an electronic apparatus 100, a battery case 102 includes an ABS, and a gap 103 having a size of 1 mm was provided between the aluminum sheet metal 101 and the battery case 102. A configuration of the electronic apparatus 100 other than these component is similar to those in the first embodiment described above.

COMPARATIVE EXAMPLE 2

As illustrated in FIG. 4B, a heat storage material 201 (composite material of $VO_2$ and ABS (33 vol % and 67 vol % respectively)) was provided between a control circuit 15 and a battery 16 without providing any gap inside a housing 11 of an electronic apparatus 200. The heat storage material 201 also functions as a battery case. A configuration of the electronic apparatus 200 other than these component is similar to those in the first embodiment described above.

WORK EXAMPLE

Similar to the first embodiment described with reference to FIG. 1, a first heat storage material 18a was provided in a manner thermally connected to a control circuit 15 via a heat dissipation sheet 17 and a second heat storage material 18b was provided in a manner contacting a battery 16. Additionally, a gap 19 having a size of 0.7 mm was provided between the first heat storage material 18a and the second heat storage material 18b. A composite material of $VO_2$ and ABS (33 vol % and 67 vol % respectively) was used for both of the first heat storage material 18a and the second heat storage material 18b. A latent heat storage density of the present work example was 80 J/cc, and the thermal conductivity was 0.9 W/m·K.

[Evaluation]

In the Work Example indicated by a solid line in the graph of FIG. 3, temperature rise of the battery 16 was suppressed and a time before reaching a limit temperature that is a limit at which operation of the battery 16 becomes restricted was extended by about 27%, compared to Comparative Example 1 indicated by a dot-and-dash line.

Additionally, in Work Example, temperature rise of the battery 16 was suppressed and a time before reaching a limit temperature that is a limit at which operation of the battery 16 becomes restricted was extended by about 5.7%, compared to Comparative Example 2 indicated by a broken line in the graph of FIG. 3.

In Work Example, it can be confirmed that temperature rise of the battery 16 can be largely suppressed by providing the first heat storage material 18a and the second heat storage material 18b, compared to Comparative Example 1 in which no heat storage material was provided.

Additionally, in Work Example, it can be confirmed that movement of heat from the control circuit 15 to the battery 16 was suppressed by existence of the gap 19 and temperature rise of the battery 16 was suppressed, compared to Comparative Example 2 in which the heat storage material 201 is provided but no gap is provided.

Since temperature rise of the battery 16 is suppressed, a usable time such as a recording time can be extended, restriction of a function due to temperature rise (thermal shutdown) can be prevented, discomfort feeling given to a user can be reduced, reliability of the apparatus can be improved, and the life of the apparatus can be extended, for example.

Meanwhile, since the first heat storage material 18a and the second heat storage material 18b are provided inside the housing 11, it is possible to achieve other effects such as improvement of impact resistance (robustness) and improvement of a drip-proof property (waterproof property) of the electronic apparatus 10.

2. SECOND EMBODIMENT

[2-1. Configuration of Electronic Apparatus]

Figure 5:
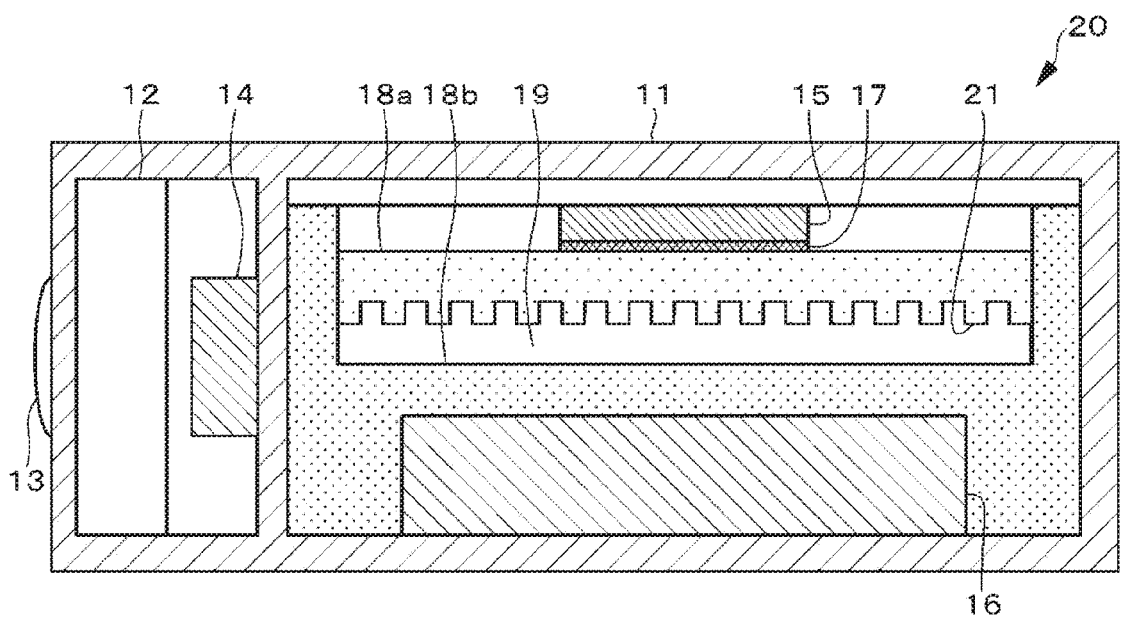
FIG. 5 is a schematic cross-sectional plan view illustrating an internal configuration of an electronic apparatus according to a second embodiment.

An exemplary configuration of an electronic apparatus 20 according to a second embodiment of the present technology will be described with reference to FIG. 5. Meanwhile, since a configuration of the electronic apparatus 20 other than a first heat storage material 18a is similar to that of a first embodiment, the description thereof will be omitted. In the second embodiment also, the description will be provided by exemplifying an imaging device as the electronic apparatus 20 in a manner similar to the first embodiment.

A plurality of uneven surfaces 21 is formed on an entire portion of a surface of the first heat storage material 18a located on an opposite side of a control circuit 15 side, namely, the surface facing a gap 19. The uneven surface 21 is adopted to increase an surface area of the surface of the first heat storage material 18a on the gap 19 side. The uneven surface 21 is an example of a "shape that increases a surface area" recited in the claims. With this configuration, heat radiation efficiency from the first heat storage material 18a to the air can be improved, and heat movement to a battery 16 can be suppressed by promoting natural convection inside the housing 11 and uniformly diffusing the heat inside a housing 11. Therefore, temperature rise of the battery 16 can be more efficiently suppressed, a usable time such as a recording time can be extended, restriction of a function due to temperature rise (thermal shutdown) can be prevented, discomfort feeling given to a user can be reduced, reliability of the apparatus can be improved, and the life of the apparatus can be extended, for example.

3. THIRD EMBODIMENT

[3-1. Configuration of Electronic Apparatus]

Figure 6:
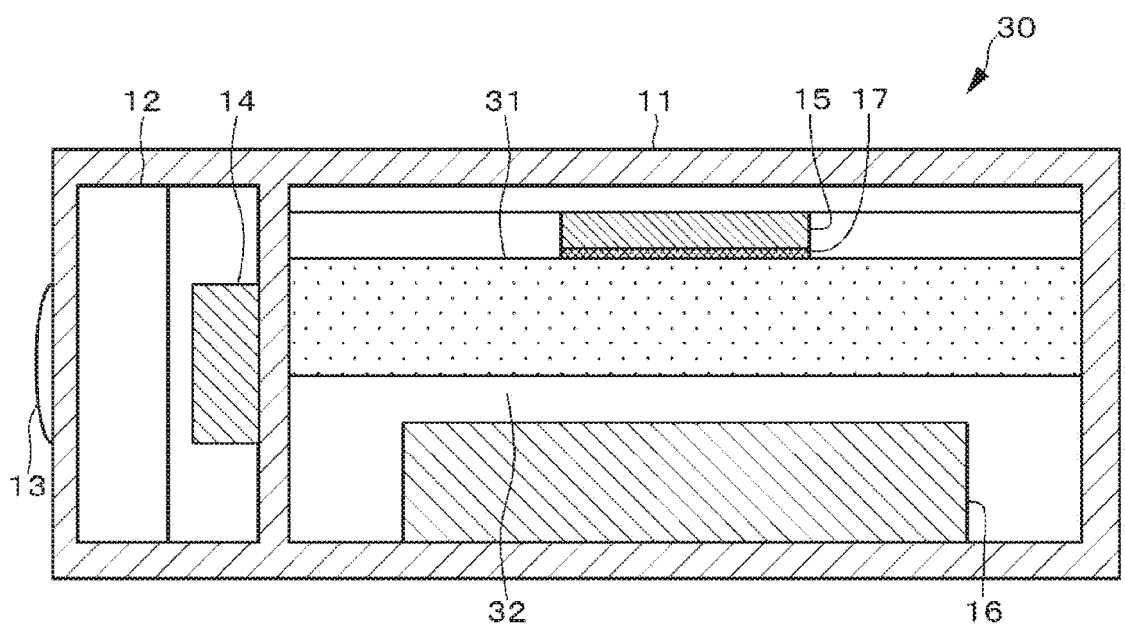
FIG. 6 is a schematic cross-sectional plan view illustrating an internal configuration of an electronic apparatus according to a third embodiment.

An exemplary configuration of an electronic apparatus 30 according to a third embodiment of the present technology will be described with reference to FIG. 6. Since the configuration of the electronic apparatus 30 other than a heat storage material 31 and a gap 32 is similar to that of a first embodiment, the description thereof will be omitted. In the third embodiment also, the description will be provided by exemplifying an imaging device as the electronic apparatus 30 in a manner similar to the first embodiment.

In the third embodiment, the heat storage material 31 is provided in manner thermally connected to a control circuit 15 via a heat dissipation sheet 17. On the other hand, no heat storage material is provided in a manner contacting a battery 16, and the heat storage material 31 does not also contact the battery 16, and a gap 32 is formed between the heat storage material 31 and the battery 16. The battery 16 and the gap 32 are formed in a manner directly contacting each other.

With this configuration, heat generated from the control circuit 15 is stored in the heat storage material 31 and the gap 32 can prevent the heat from being moved to the battery 16, thereby suppressing temperature rise of the battery 16. Consequently, a usable time such as a recording time can be extended, restriction of a function due to temperature rise (thermal shutdown) can be prevented, discomfort feeling given to a user can be reduced, reliability of the apparatus can be improved, and the life of the apparatus can be extended, for example.

As described above, the first to third embodiments of the present technology are configured.

4. MODIFIED EXAMPLES

While the embodiments of the present technology have been concretely described, the present technology is not limited to the above-described embodiments, and various kinds of modifications can be made on the basis of the technical idea of the present technology.

A heat storage material may not be directly thermally connected to a control circuit 15 but may be thermally connected to a unit including a board on which the control circuit 15 is implemented. Also, the heat storage material may be thermally connected to a battery case where the battery 16 is arranged.

In the first and second embodiments, the second heat storage material 18b also functions as a battery case, but the second heat storage material 18b does not necessarily function as the battery case. The second heat storage material 18b may be provided not as the battery case, but may also be provided in a manner directly contacting the battery 16 or in a manner thermally connected to a battery case.

The first heat storage material 18a may directly physically contact the control circuit 15 without providing any heat dissipation sheet 17.

The gap 19 may be formed in a substantially linear shape, a curved shape, or the like extending obliquely between the control circuit 15 and the battery 16 besides being formed in a substantially linear shape extending substantially perpendicular to the direction in which the control circuit 15 and the battery 16 are aligned.

In the first embodiment and the second embodiment, one heat storage material may be provided instead of providing two heat storage materials such as the first heat storage material 18a and the second heat storage material 18b in the housing 11, and the gap 19 may be provided by forming a cut-away portion in the one heat storage material.

In the second embodiment, not only the first heat storage material 18a but also the uneven shape or the like may be provided also on a surface of the second heat storage material 18b on the gap side as a shape that increases a surface area.

In the second embodiment, the shape that increases the surface area is not limited to only the above-described uneven shape, and any shape that can increase the surface area of the heat storage material is applicable, such as a shape including a hole and a shape including a lattice-shaped grooves.

The present technology is not limited to the above-described imaging element 14, control circuit 15, and battery 16 in the embodiments, but is effective for any heat source that generates heat inside an electronic apparatus.

The electronic apparatus according to the present technology is applicable to any kind of apparatus including an imaging element, such as a small digital video camera used to record own activities of a devotee of outdoor sports, a digital camera, a television receiver, a notebook computer, a smartphone, a tablet terminal, a portable game machine, a wristwatch type wearable terminal, a glasses type wearable terminal, a car navigation system, an intercommunication system, a robot, a robot cleaner, and the like. With application of the present technology to electronic apparatus including the above-described imaging elements, it is possible to prevent respective portions such as the imaging element, a control circuit, and a battery from reaching an upper limit temperature at which operation becomes impossible, and therefore, an usable time such as shooting time can be extended, for example.

Note that the present technology may also adopt the following configurations.

(1) An electronic apparatus including:
a housing;
a control circuit provided inside the housing;
a battery provided inside the housing;
a heat storage material provided between the control circuit and the battery inside the housing; and
a gap provided between the control circuit and the battery.

(2) The electronic apparatus recited in (1) above, in which the heat storage material is provided in a manner thermally connected to the control circuit and the battery.

(3) The electronic apparatus recited in (1) or (2) above, in which the heat storage material is provided in a manner thermally connected to at least a surface of the control circuit facing the battery and a surface of the battery facing the control circuit.

(4) The electronic apparatus recited in any one of (1) to (3) above, in which a shape that increases a surface area is formed on a surface of the heat storage material contacting the gap.

(5) The electronic apparatus recited in (4) above, in which the shape that increases the surface area is formed at least on a surface on the control circuit side out of the surface of the heat storage material contacting the gap.

(6) The electronic apparatus recited in any one of (1) to (5) above, in which the heat storage material includes a first heat storage material thermally connected to the control circuit and a second heat storage material thermally connected to the battery.

(7) The electronic apparatus recited in (6) above, in which the first heat storage material includes a latent heat storage material, and has a transition temperature of about 50 degrees or more and 80 degrees or less.

(8) The electronic apparatus recited in (6) above, in which the second heat storage material includes a latent heat storage material, and has a transition temperature of about 40 degrees or more and 70 degrees or less.

(9) The electronic apparatus recited in (1) above, in which the gap contacts the heat storage material on the control circuit side, and contacts the battery on the battery side.

(10) The electronic apparatus recited in any one of (1) to (9), in which the heat storage material includes a latent heat storage material.

(11) The electronic apparatus recited in any one of (1) to (10) above, in which the heat storage material includes a composite material of a heat storage material and a resin.

(12) The electronic apparatus recited in any one of (1) to (10) above, in which the heat storage material includes a composite material of a heat storage material and a metal.

REFERENCE SIGNS LIST 10, 20, 30 Electronic apparatus
11 Housing
15 Control circuit
16 Battery
18a First heat storage material
18b Second heat storage material
19, 32 Gap
21 Uneven surface
31 Heat storage material

The invention claimed is:

1. An electronic apparatus, comprising:
a housing;
a control circuit inside the housing;
a battery inside the housing;
a first heat storage material inside the housing, wherein a first surface of the first heat storage material is thermally connected to the control circuit;
a second heat storage material inside the housing, wherein the second heat storage material is in direct conductive thermal contact with two or more surfaces of the battery and two or more inner surfaces of the housing, and
both ends of the first heat storage material are in direct conductive thermal contact with inner surface of the second heat storage material; and
a gap between the first heat storage material and the second heat storage material, wherein
a second surface of the first heat storage material and a second surface of the second heat storage material contacts the gap,
the first surface of the first heat storage material is opposite to the second surface of the first heat storage material, and
the first surface of the second heat storage material is opposite to the second surface of the second heat storage material.

2. The electronic apparatus according to claim 1, wherein the first surface of the first heat storage material is thermally connected to a surface of the control circuit that faces the battery.

3. The electronic apparatus according to claim 1, wherein
a shape that increases a surface area of the first heat storage material is on the second surface of the first heat storage material that contacts the gap.

4. The electronic apparatus according to claim 1, wherein a shape that increases a surface area is on the second surface of the first heat storage material opposite to the first surface of the first heat storage material that faces the control circuit.

5. The electronic apparatus according to claim 1, wherein the first heat storage material includes a latent heat storage material, and
the first heat storage material has a transition temperature of 50 degrees Celsius or more and 80 degrees Celsius or less.

6. The electronic apparatus according to claim 1, wherein the second heat storage material includes a latent heat storage material, and
the second heat storage material has a transition temperature of 40 degrees Celsius or more and 70 degrees Celsius or less.

7. The electronic apparatus according to claim 1, wherein the gap contacts the second heat storage material on a battery side of the housing.

8. The electronic apparatus according to claim 1, wherein the first heat storage material includes a latent heat storage material.

9. The electronic apparatus according to claim 1, wherein the first heat storage material includes a composite material of a heat storage material and a resin.

10. The electronic apparatus according to claim 1, wherein the first heat storage material includes a composite material of a heat storage material and a metal.

* * * * *